US012665609B2

(12) United States Patent　　(10) Patent No.: US 12,665,609 B2
　　Chen et al.　　　　　　　　　　(45) Date of Patent: Jun. 23, 2026

(54) SIGNAL CONVERTER WITH DELAY ARCHITECTURE FOR CONCURRENT SIGNAL PROCESSING

(71) Applicant: University of Southern California, Los Angeles, CA (US)

(72) Inventors: Shuo-Wei Chen, Los Angeles, CA (US); Mohsen Hassanpourghadi, Los Angeles, CA (US); Juzheng Liu, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 207 days.

(21) Appl. No.: 18/719,024

(22) PCT Filed: Oct. 14, 2022

(86) PCT No.: PCT/US2022/046783
　§ 371 (c)(1),
　(2) Date: Jun. 12, 2024

(87) PCT Pub. No.: WO2023/113914
　PCT Pub. Date: Jun. 22, 2023

(65) Prior Publication Data
　US 2025/0030433 A1　Jan. 23, 2025

Related U.S. Application Data

(60) Provisional application No. 63/290,012, filed on Dec. 15, 2021.

(51) Int. Cl.
　*H03M 1/50*　(2006.01)
　*H03M 1/16*　(2006.01)

*H03K 4/94*　(2006.01)
　*H03K 5/01*　(2006.01)
　*H03M 1/38*　(2006.01)

(52) U.S. Cl.
　CPC ............. *H03M 1/50* (2013.01); *H03M 1/164* (2013.01); *H03K 4/94* (2013.01); *H03K 5/01* (2013.01); *H03M 1/38* (2013.01)

(58) Field of Classification Search
　CPC .......... H03M 1/50; H03M 1/164; H03M 1/38; H03M 1/1245; H03K 4/94; H03K 5/01
　See application file for complete search history.

(56) References Cited

U.S. PATENT DOCUMENTS 10,962,933 B1　3/2021　Waltari
2016/0241301 A1　8/2016　Pavlovic et al.
(Continued)

OTHER PUBLICATIONS

International Search Report and Written Opinion on International Patent Application No. PCT/US2022/046783 dated Mar. 28, 2023 (14 pages).

*Primary Examiner* — Joseph J Lauture
(74) *Attorney, Agent, or Firm* — Foley & Lardner LLP

(57)　　ABSTRACT

Aspects of this technical solution can include a plurality of SAR TC stages configured to convert an input time signal to a digital code including a plurality of output signals each corresponding to a SAR TDC stage among the plurality of SAR TDC stages connected to an input of a following SAR TDC stage among the plurality of SAR TDC stages, where the SAR stage is controlled by a clock signal based on a delayed clock signal from a previous SAR TDC stage among the plurality of SAR TDC stages.

20 Claims, 10 Drawing Sheets

100

(56)  References Cited

U.S. PATENT DOCUMENTS

| | | | |
|---|---|---|---|
| 2016/0359493 | A1 | 12/2016 | Chen et al. |
| 2017/0357219 | A1* | 12/2017 | Chiu ........................ H03M 1/38 |
| 2018/0076821 | A1 | 3/2018 | Loke et al. |
| 2021/0226643 | A1 | 7/2021 | Moon et al. |
| 2023/0198510 | A1* | 6/2023 | Whitcombe ............ H03M 1/50 |
| | | | 327/130 |

\* cited by examiner

900

1000

| Perform Voltage-to-Time Conversion of Input Signal | 1010 |

| Generate the First Digital Bit and Tune Delay of First Time-Domain Signal | 1020 |

| Generate Subsequent Digital Bit(s) and Tune Delay of Subsequent Time-Domain Signal(s) | 1030 |

1100

| Convert Input Time-Domain Signal to Bit of Digital Code | 1110 |

| Transmit Output Time-Domain Signal to Input of Following Time-Domain Conversion Stage | 1120 |

SIGNAL CONVERTER WITH DELAY ARCHITECTURE FOR CONCURRENT SIGNAL PROCESSING

CROSS-REFERENCE TO RELATED APPLICATIONS

This application is a national phase application of International Application No. PCT/US2022/046783, filed Oct. 14, 2022, which claims the benefit of priority under 35 U.S.C. § 119 to U.S. Provisional Patent Application Ser. No. 63/290,012, entitled "TIME-DOMAIN ANALOG-TO-DIGITAL CONVERTER SYSTEMS AND DEVICES WITH SUCCESSIVE APPROXIMATION REGISTER TIME-TO-DIGITAL CONVERTERS AND METHODS OF OPERATION THEREWITH," filed Dec. 15, 2021, the contents of such applications being hereby incorporated by reference in their entireties and for all purposes as if completely and fully set forth herein.

STATEMENT REGARDING FEDERALLY SPONSORED RESEARCH OR DEVELOPMENT

This invention was made with government support under Grant Number FA8650-18-2-7853, awarded by Defense Advanced Research Projects Agency Posh Open Source Hardware (DARPA POSH). The government has certain rights in the invention.

TECHNICAL FIELD

The present implementations relate generally to electronic devices, and more particularly to a signal converter with a delay architecture for concurrent signal processing.

INTRODUCTION

Demand for higher speed, throughput, and miniaturization of electronic device architectures is increasing. Specifically, computing applications with these demands are present in an increasing array of specialized applications.

SUMMARY

Aspects of this technical solution are directed to an analog-to-digital converter (ADC) including a pipelined-successive approximation register (SAR) time-to-digital converter (TDC) architecture, a common-mode voltage-time-converter, and a delay difference generation device. The pipelined-SAR TDC in accordance with present implementations can provide a technical improvement of a reduced device complexity at a circuit level, a reduced size, a reduced cost, and improved throughput. The pipelined-SAR TDC converter can include a number of SAR TDC stages to convert the input time-domain signal into digital output bits. The ADC of this technical solution can include a delay architecture to the clock signal to provide a technical improvement to simultaneous or concurrent processing of multiple input time-domain samples. For example, the pipelined-SAR TDC can be configured to output multiple concurrent or simultaneous digital signals from a plurality of stages of an ADC. For example, the delay architecture can be configured to output multiple concurrent or simultaneous digital signals from a phase of an ADC, with each phase including multiple stages. Thus, a technological solution for a signal converter with a delay architecture for concurrent signal processing is provided.

At least one aspect is directed to a pipelined successive approximation register (SAR) time-to-digital converters (TDC) device. The apparatus can include a plurality of SAR TC stages configured to convert an input time signal to a digital code can include a plurality of output signals each corresponding to a SAR TDC stage among the plurality of SAR TDC stages connected to an input of a following SAR TDC stage among the plurality of SAR TDC stages, where the SAR stage is controlled by a clock signal based on a delayed clock signal from a previous SAR TDC stage among the plurality of SAR TDC stages.

At least one aspect is directed to a pipelined time-to-digital converters (TC) method. The method can include converting, by a plurality of time-domain conversion stages, an input time-domain signal to a corresponding bit of a digital code in accordance with a cascade configuration. The method can include transmitting, by a time-domain conversion stage among the plurality of time-domain conversion stages, an output time-domain signal of the time-domain conversion stage to an input of a following time-domain conversion stage among the plurality of time-domain conversion stages, where each stage is controlled by a clock signal based on a delayed clock signal from a previous time-domain conversion stage among the plurality of time-domain conversion stages.

At least one aspect is directed to a delay difference generation device. The apparatus can include a tunable delay cell having a delay based on an input digital code and modifiable in response to tuning one or more of a pull-up strength and a pull-down strength of an inverter by a switch.

At least one aspect is directed to a voltage-to-time converter (VTC) device. The apparatus can include a common-mode capacitor coupled with a center node of one or more voltage sampling capacitors. The apparatus can include a current source coupled with the common-mode capacitor and configured to charge the common-mode capacitor.

At least one aspect is directed to a successive approximation register (SAR) time-to-digital converter (TDC) device. The apparatus can include a time comparator that compares the input time-domain signals and generates the output digital bits. The apparatus can include a delay difference generation device following the time comparator to create a delay difference to the input time-domain signal. The apparatus can include a time comparator that compares the input time-domain signal to a reference time signal and generates the output digital bits. The apparatus can include a delay difference generation device following the time comparator to create a delay difference to the reference time-domain signal.

At least one aspect is directed to a pipelined time-to-digital converter (TDC) method. The method can include a plurality of time-domain conversion stages that successively convert the input time signal to digital code. The output time-domain signal of each time-domain conversion stage is connected to the input of the next time-domain conversion stage. Each stage is controlled by a clock signal. That clock signal of each stage is a delayed clock signal from the previous stage. The method can include one or a plurality of time-domain conversion stages, consist of comparators for time-domain signal comparison and delay cell to generation delay/time difference. The method can include A time-domain conversion stage that can convert the input time domain signal into one or a plurality of digital bits At least one aspect is directed to a delay difference generation device. The apparatus can include a tunable delay cell, with the delay controlled by an input digital code. The tunable delay is realized by tuning the pull-up and/or pull-down strength of an inverter by a switch. The apparatus can include one or a plurality of inverters with tunable pull-down strength. The apparatus one or a plurality of paths with tunable delay.

At least one aspect is directed to a voltage-to-time converter (VTC) device. The apparatus can include a common-mode capacitor connected to the center node of the voltage sampling capacitors, and a current source to charge the common mode capacitor. The apparatus can include a one or a plurality of voltage sampling capacitors with a common-mode capacitor connected to the bottom plate or center node. The apparatus can include a one or a plurality of common-mode capacitors connected to the center node of the voltage sampling capacitors. The apparatus can include a one or a plurality of current source that charges the common-mode capacitor.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Figure 1:
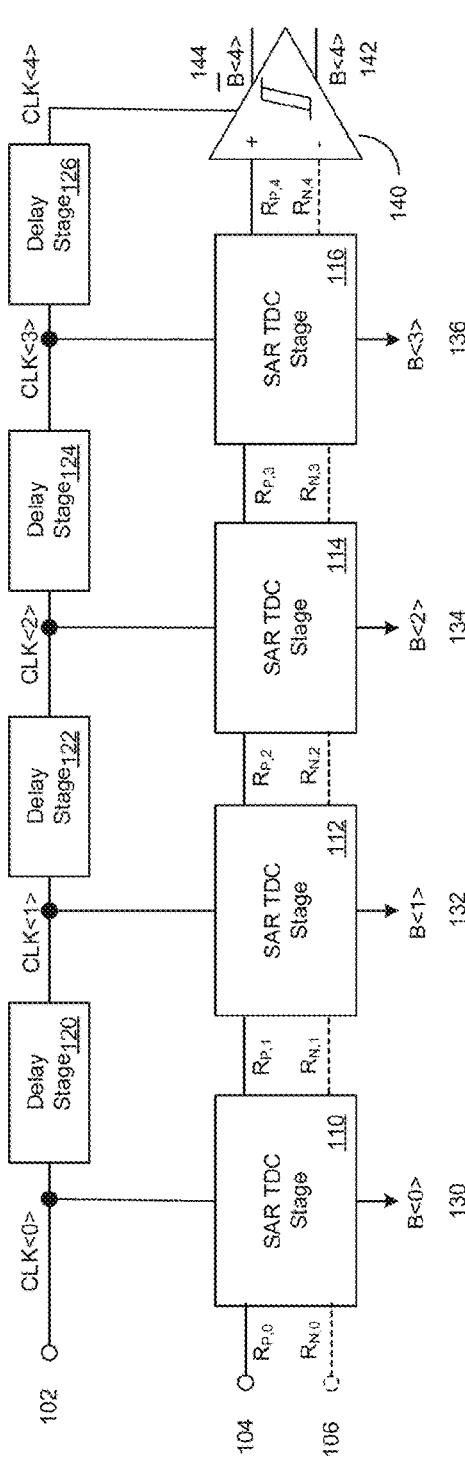
FIG. 1 depicts an example pipelined SAR TDC, in accordance with present implementations.

Present implementations can advantageously achieve a high-speed time-domain ADC with a low-complexity TDC with fine LSB resolution. FIG. 1 shows TDCs with fine time resolution and the SAR TDC using SDT cells. A time-domain ADC can encode the input voltage information into a time difference between two pulses (e.g., PP and PN in FIG. 1), and can use TDC for digitization. A Vernier delay line-based TDC can use the delay difference between two delay chains ($\tau_2-\tau_1$ in FIG. 1) for time quantization. The TDC can include 2N+1 delay cells and 2N time comparators for an N-bit conversion, resulting in significant power and area overhead. To alleviate requirement for a large number of delay cells in addition to extra MUX delay, present implementations are advantageously directed to a SAR TDC architecture that dynamically changes the delay based on the time comparison result during bit trials, referred to as selective delay tuning. Whenever a bit trial reaches a decision, the SDT cell can insert an extra delay to either positive or negative side of the TDC chain. The resulting delay difference can be used as the reference time for the successive approximation (SA) algorithm. Therefore, an N-bit SAR TDC in accordance with present implementations can include only 4. (N−1) delay cells and N time comparators without MUX, leading to lower noise and area/power consumption.

Present implementations can include high-speed (>GS/s) medium-resolution ADCs for wideband communication ICs. Voltage-domain time-interleaved (TI) SAR ADC can demonstrate superior power efficiency. Single-channel sample rate can be limited to <1 GS/s, necessitating a large number of TI channels in high sample rate scenarios. Thus, implementation overhead can increase for this version of the architecture, including capacitive loading to the input driver and total area consumption. Time-domain ADCs demonstrate advantageously improved sampling speed. Circuit complexity for some Flash TDC grows exponentially with the target bit resolution. Thus, SAR TDCs with such architectures can demonstrate a lower complexity but are generally limited in sample rate (MS/s).

Present implementations can include a two-step time-domain ADC that uses a first-stage Flash TDC with the residue time quantized by the second-stage SAR TDC, targeting>GS/s regime. To advantageously improve the throughput of SAR TDC conversion, a delay-tracking pipelining technique can allow the SAR TDC to quantize two residue time samples, concurrently or simultaneously. At the circuit level, a selective delay tuning (SDT) cell can provide the time reference required for SAR conversion by reducing the number of delay stages, or without using an excessive number of delay stages. An ADC in accordance with present implementations can be implemented in 14 nm CMOS technology with 2× time interleaving. This implementation can advantageously achieve significantly increased throughput, of 10 GS/s with 37.2 dB SNDR at Nyquist frequency. Present implementations can demonstrate an energy efficiency of 24.8 fJ/conv-step and occupy an active area of 2850 um². This efficiency and area are the highest energy efficiency and smallest area consumption for ADCs with comparable throughput.

FIG. 1 depicts an example system 100, in accordance with present implementations. As illustrated by way of example, FIG. 1 can include at least a clock input node 102, a first source input node 104, a second source input node 106, SAR TDC stages 110, 112, 114 and 116, a delay stages 120, 122, 124 and 126, a bit output nodes 130, 132, 134 and 136, and a SAR TDC comparator 140. The device can include a successive approximation register (SAR) time-to-digital converter (TDC) device. The device can include a plurality of delay difference generation cells operatively coupled in series. The device can include a comparator operatively coupled with at least one of the delay difference generation cells in series.

The clock input node 102 can receive a clock input signal having a particular duty cycle. The clock input signal can correspond to a system clock signal. The clock input node 102 can carry a signal corresponding to and include a connection with a bit at a zeroth (<0>) bit position. The first source input node 104 can receive a first time-domain signal corresponding to a first data stream. The first data stream can have a first delay corresponding to a first timing of the first data stream. The second source input node 106 can receive a second time-domain signal corresponding to a second data stream. The second data stream can have a second delay corresponding to a second timing of the second data stream distinct from the first timing of the first data stream.

The SAR TDC stages 110, 112, 114 and 116 can each compare the input time-domain signal, generated the corresponding output bits and generate different delay on the input time domain signal. For example, each of the SAR TDC stages 110, 112, 114 and 116 can correspond to a particular bit position of the first data stream and the second data stream. Thus, for example, each of the SAR TDC stages 110, 112, 114 and 116 can respectively correspond to zeroth, first, second, and third bit positions of an output bit stream. This technical solution can provide at least a technical improvement of processing multiple ADC input samples concurrently or simultaneously by concurrent or simultaneous operation of each of the SAR TDC stages 110, 112, 114 and 116. Specifically, a circuit architecture in accordance with the present examples can provide a technical improvement of at least eliminating or minimizing processing delays caused by sequential activation of each successive stage of the circuit to transform each bit position.

The delay stages 120, 122, 124 and 126 can introduce a delay of the clock signal that controls each of the SAR TDC stages 110, 112, 114 and 116. For example, each of the delay stages 120, 122, 124 and 126 can have an equal delay. For example, each of the delay stages 120, 122, 124 and 126 can have a delay corresponding to a particular stage. For example, each of the delay stages 120, 122, 124 and 126 can have a delay that increases with respect to each stage. The delay stages 120, 122, 124 and 126 can respectively generate delays based on the clock input signal. For example, the delay stages 120, 122, 124 and 126 can generate delays respectively corresponding to first, second, third, and fourth bit positions of the output bit stream. The bit output nodes 130, 132, 134 and 136 can transmit bit output values corresponding to each successive bit of the output bit stream. For example, the bit output nodes 130, 132, 134 and 136 can respectively correspond to the zeroth, first, second, third and fourth bit position of the output bit stream. The device can include a third delay circuit to receive a second clock signal and to generate the clock signal having a third time delay.

The SAR TDC comparator 140 can generate a output digital bit based on an output by the SAR TDC stage 136. The output by the SAR TDC stage 136 can include stage outputs each respectively based on the first data stream and the second data stream. The SAR TDC comparator 140 can include comparator digital output nodes 142 and 144. The comparator digital output nodes 142 and 144 can respectively transmit a first select signal and a second select signal. For example, the first digital signal can include a first digital or binary state, and the second digital signal can include a second digital or binary state opposite to the first digital or binary state.

The SAR TDC can include but is not limited to five 1-bit stages, with each stage using a time comparator to perform a single bit trial, and an delay difference generation cell to add or subtract a proper reference time. The operation mode of the time comparator can be controlled by a clock signal. When the clock signal is LOW, the outputs can be reset to VDD. When the clock signal is HIGH, the first rising edge of the two input pulses can trigger the comparator. Without pipelining, the same clock signal can be connected to all comparators, and can remain HIGH until the input pulses completely propagate through the five conversion stages, thereby limiting the TDC throughput. Alternatively, applying conventional TDC pipelining technique can result in adding additional delay to the signal path, to match the delay of each stage with the clock period, which inevitably degrades the signal SNR or incurs significant power/area overhead to lower the added noise. Present implementations can advantageously include a delay (t stage) between the clock signals for the 5-stage comparators, i.e., CLK<0:4> in FIG. 2, which does not degrade the signal SNR. The clock signal delay can track with the propagation delay of the 1-bit stage (including the comparator and SDT delay), such that the clock signal can return to LOW as soon as the input pulse propagates to the next 1-bit stage and the decision result is cached, thus increasing the throughput. As a result, two input pulses can be simultaneously processed by the SAR TDC. Present implementation can thus include a delay-tracking pipelined-SAR TDC, which helps double the throughput to reach 5 GS/s.

Figure 3:
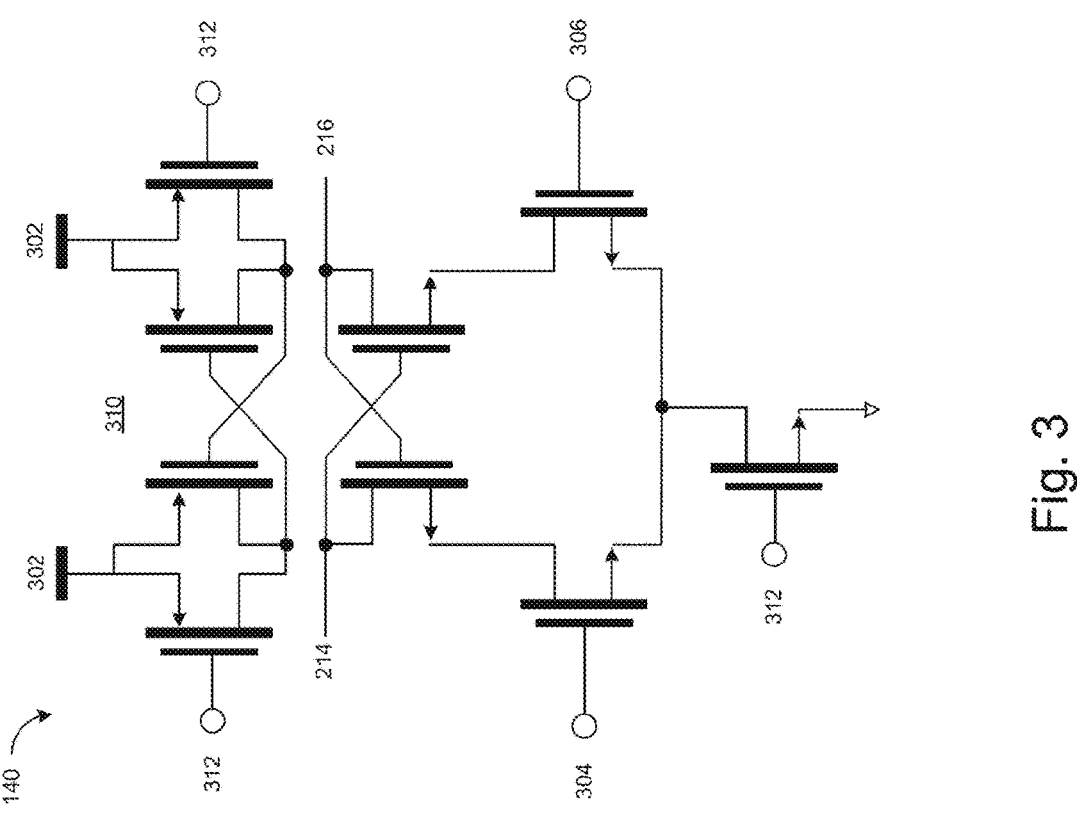
FIG. 3 depicts an example comparator, in accordance with present implementations.

Present implementations can include a two-step converter that can perform the first 3 MSB conversions using a Flash TDC, and can generate residue time signals (RP and RN) followed by the 5 LSB conversions via SAR TDC, as shown in FIG. 3. The Flash TDC and residue time generation help reduce the maximum delay required for SDT cells in SAR TDC, and hence enable optimization of the jitter performance of the SDT cells. An example measured SFDR and SNDR vs. input frequencies and the spectrum of the decimated ADC output for both single-channel and two-channel cases can include the following. The ADC shows <3 dB SNDR variation across 0.1 to 5 GHz input frequency. The single ADC channel operating at 5 GS/s can achieve a 40.78 dB SNDR and a 53.65 dB SFDR at Nyquist, leading to a 16.6 fJ/conv-step energy efficiency. The two channel ADC operating at 10 GS/s can achieve a 37.24 dB SNDR and a 50.67 dB SFDR at Nyquist, leading to a 24.8 fJ/conv-step energy efficiency.

Figure 2:
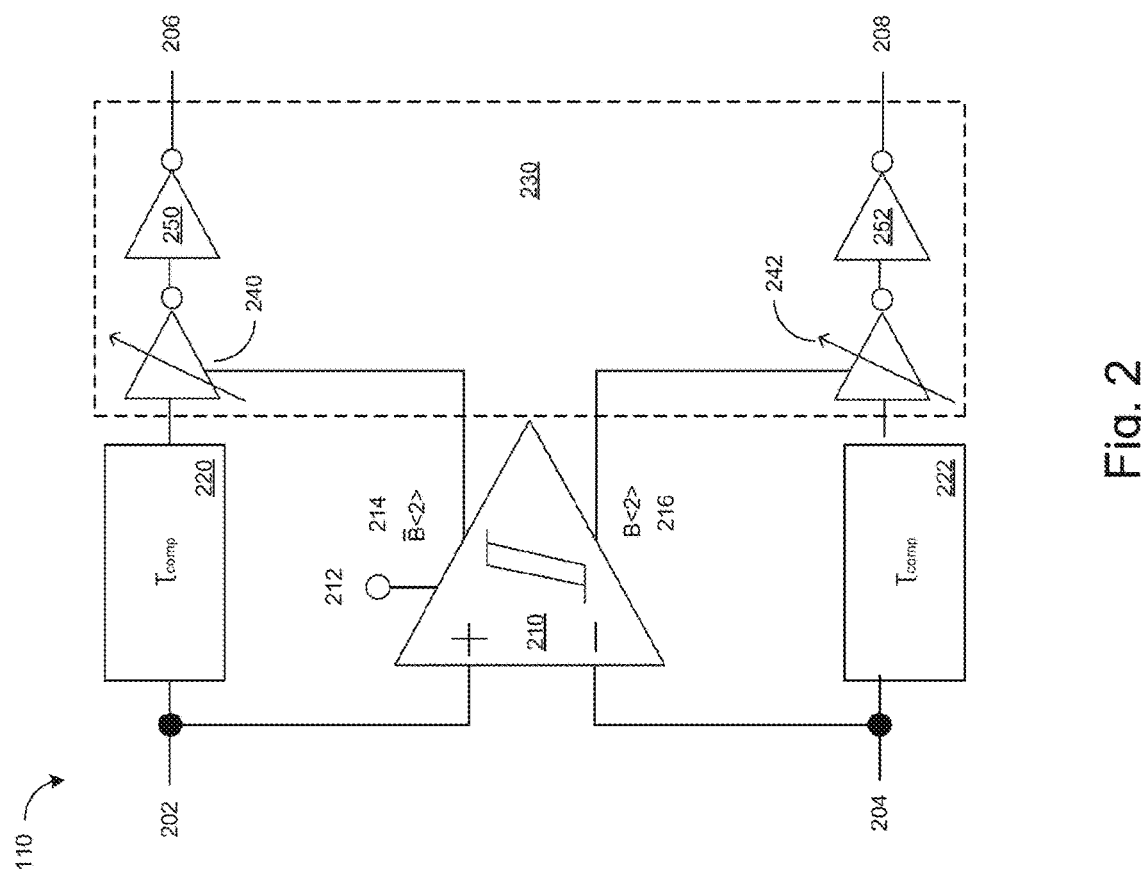
FIG. 2 depicts an example SAR TDC stage, in accordance with present implementations.

FIG. 2 depicts an example SAR TDC stage 200, in accordance with present implementations. As illustrated by way of example, FIG. 2 can include at least a SAR TDC 200 having a first stage input node 202, a second stage input node 204, a first stage output node 206, a second stage output node 208, a stage comparator 210, first and second delay cells 220, and a delay difference generation cell 230.

The first stage input node 202 can receive a first analog input signal from the first source input node 104 or a first output of a preceding SAR TDC stage. For example, the first output of the preceding SAR TDC stage can be based on the first analog input signal, and can be transformed by one or more preceding stages having one or more of structure and operation corresponding to the SAR TDC stage 200. The second stage input node 204 can receive a second analog input signal from the second source input node 104 or a second output of a preceding SAR TDC stage. For example, the second output of the preceding SAR TDC stage can be based on the second analog input signal, and can be transformed by one or more preceding stages having one or more of structure and operation corresponding to the SAR TDC stage 200.

The stage comparator 210 can generate one or more digital outputs based on input from the first stage input node 202 and the second stage input node 204. The stage comparator 210 can include a noninverting input coupled with the first stage input node 202 and an inverting input coupled with the second stage input node 204. The stage comparator 210 can include a clock input node 212, a first digital output node 214, and a second digital output node 216. The clock input node 212 can receive a clock input signal from the clock input node 102 or a clock input signal of a preceding delay stage among the delay stages 120, 122, 124 and 126. The first stage digital output node 214 can generate a digital output based on input from the first stage input node 202 and the second stage input node 204. For example, the first digital output node 214 can include a first digital or binary state. The second digital output node 216 can generate a digital output based on input from the first input node 202 and the second input node 204. For example, the second digital output node 216 can include a second digital or binary state opposite to the first digital or binary state. The device can include a first comparator to receive a clock signal and to generate the first digital signal and the second digital signal based on the clock signal. The comparator can be operatively coupled to an output of a first delay difference generation cell among the delay difference generation cells, where the comparator is operatively coupled to an input of a second delay difference generation cell among the delay difference generation cells, and where the delay difference generation cells each comprise a respective reference time step.

The first and second delay cells 220 can generate a predetermined delay. The predetermined delay can be applied to each of the first input node 202 and the second input node 204. The first and second delay cells 220 can generate first and second delayed output signals that can respectively be provided as input to the delay difference generation stage 230. The device can include a first delay cell having an input coupled with a first input of the comparator, the first delay cell to generate a third delay signal based on the first input signal and the first digital signal. The device can include a second delay cell having an input coupled with a second input of the comparator, the second delay cell to generate a fourth delay signal based on the second analog input signal and the second digital signal.

The delay difference generation stage 230 can generate modified or tuned analog output signals having a relative delay different than a relative delay between the signals received at the first stage input node 202 and the second stage input node 204. The delay difference generation stage 230 can include a first variable delay inverter 240, a second variable delay inverter 242, a first output inverter 250, a second output inverter 252, a first output node 260, and a second output node 262.

The first variable delay inverter 240 can modify the first delayed output signal based on a digital signal received by the first stage digital output node 214. For example, the first variable delay inverter 240 can apply a delay selectively based on a binary value of the digital signal received by the first stage digital output node 214. For example, a magnitude of the delay applied by the first variable delay inverter 240 can be based on a value, delay, magnitude, or any combination thereof, of the first delayed output signal. The first variable delay inverter 240 can correspond to a first variable output circuit. The device can include a first variable output circuit having an input coupled with an output of the first delay cell. The device can include the first variable output circuit to generate the first delay signal based on the third delay signal and the first time-domain input signal.

The second variable delay inverter 242 can modify the second delayed output signal based on a digital signal received by the second stage digital output node 214. For example, the second variable output amplifier 242 can apply a delay selectively based on a binary value of the digital signal received by the second stage digital output node 216. For example, a magnitude of the delay applied by the second variable delay inverter 242 can be based on a value, delay, magnitude, or any combination thereof, of the second delayed output signal. The first output inverter 250 can buffer an output of the first variable delay inverter 240 with a predetermined delay. The second stage output amplifier 252 can buffer an output of the second variable delay inverter 242 with a predetermined delay. The second variable delay inverter 242 can correspond to a second variable output circuit. The device can include the second variable output circuit to generate the second delay signal based on the fourth delay signal and the second analog input signal. The device can include a second variable output circuit having an input coupled with an output of the second delay cell.

The first stage output node 260 can transmit an output of the first stage output amplifier inverter 250 to a successive or next SAR TDC stage. For example, the first stage output node 260 can transmit an output of the first stage output inverter 250 to a first stage input node of a successive or next SAR TDC stage coupled with the SAR TDC stage 200. The second stage output node 262 can transmit an output of the second stage output inverter 252 to a successive or next SAR TDC stage. For example, the second stage output node 262 can transmit an output of the second stage output inverter 252 to a second stage input node of a successive or next SAR TDC stage coupled with the SAR TDC stage 200.

FIG. 3 depicts an example comparator 300, in accordance with present implementations. As illustrated by way of example, FIG. 3 can include at least an input voltage node 302, a first comparator source input node 304, a second comparator source input node 306, a transistors 310, and a comparator clock input nodes 312. The input voltage node 302 can receive a supply voltage. For example, the supply voltage can include a DC voltage of 5 V or 12 V. The first comparator source input node 304 can correspond to a noninverting input node of the stage comparator 210. The second comparator source input node 306 can correspond to an inverting input node of the stage comparator 210. The transistors 310 can correspond to a structure of the stage comparator 210. For example, one or more of the transistors 310 can correspond to field-effect transistors (FETs). The comparator clock input nodes 312 can couple with the clock input node 212.

Figure 4:
FIG. 4 depicts an example system, in accordance with present implementations.
Figure 4:
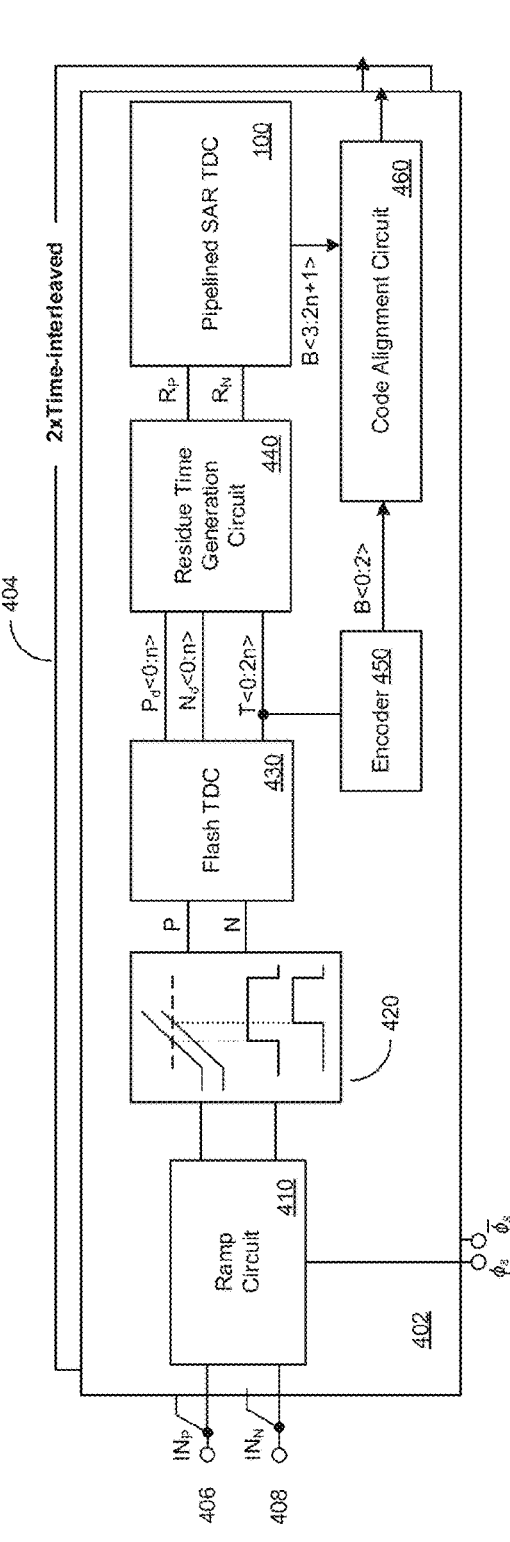

FIG. 4 depicts an example ADC 400, in accordance with present implementations. As illustrated by way of example, FIG. 4 can include at least a primary block 402, an encoder 450 402, and a secondary block 404.

The primary block 402 can include an analog signal processing circuit interleaved with the secondary block 404. For example, the interleaving can include operation of the primary block 402 concurrently with the secondary block 404 in accordance with a predetermined duty cycle. The primary block 402 can include a first source input node 406, a second source input node 408, a ramp circuit 410, a signal transformer 420, a flash TDC 430, a residue time generation circuit 440, and a code alignment circuit 460. a first source input node 406, a second source input node 408, a ramp circuit 410, a signal transformer 420, a flash TDC 430, a residue time generation circuit 440, and a code alignment circuit 460. The first source input node 406 can receive a first analog input signal from an external device. The second source input node 408 can receive a second analog input signal from an external device either corresponding to or distinct from the external device from which the first analog input signal is received at the first source input node 406. The ramp circuit 410 can generate one or more ramped signals based on one or more of the first analog input signal and the second analog input signal from an external device.

The signal transformer 420 can transform the ramped signals received from the ramp circuit 410 into time-domain pulse signals. For example, the signal transformer 420 can convert an analog ramp signal to a time-domain pulse based on an activation threshold. The activation threshold can have a magnitude corresponding to a particular voltage, current, or the like. For example, the signal transformer 420 can output an instantaneous "low" or "zero" level for any ramp signal having a magnitude below the activation threshold, and can output an instantaneous "high" or "one" level for any ramp signal having a magnitude at or above the activation threshold. This transformation can provide a technical improvement of normalizing and simplifying analog input waveforms to detect and adjust delay instantaneously as the input analog signals are received. The flash TDC 430 can generate signals each corresponding to a particular bit positions and based on the output of the signal transformer 420. The residue time generation circuit 440 can generate analog input signals based on the output of the flash TDC 430, and can provide the generated signals to the pipelined SAR TDC 100. The pipelined SAR TDC can correspond to the system 100.

The encoder 450 can generate a prefix code based on one or more bits corresponding to a timing word generated by the flash TDC 430. For example, the prefix code can include the first three bits of an output bit sequence. The code alignment circuit 460 can generate one or more data bits of a bit sequence based on the output of the pipelined SAR TDC 100. For example, the prefix code and the prefix code can together correspond to an output data stream.

In order to linearly encode the sampled voltage information into the rising edge difference of two pseudo-differential pulses (P and N in FIG. 3), the sampled voltage can be ramped up and compared to a certain voltage threshold in the voltage-to-time conversion (VTC) block. Ramps can be generated on both sampling capacitors via two separate charge pumps, for example. This ramp generation process can be vulnerable to distortion, memory effect, and signal-dependent charge kickbacks. To improve the fidelity of VTC, present implementations can create a common-mode ramp by charging a capacitor (Ccm) at the center node (Vc) of the sampling capacitors. After the VTC is completed, the Ccm can be reset to reduce memory effect and signal-dependent charge kickbacks to the input. Lastly, because ramp generation in accordance with present implementations can be performed with a single charge pump, the ramp slope mismatch can be advantageously avoided.

Figure 5:
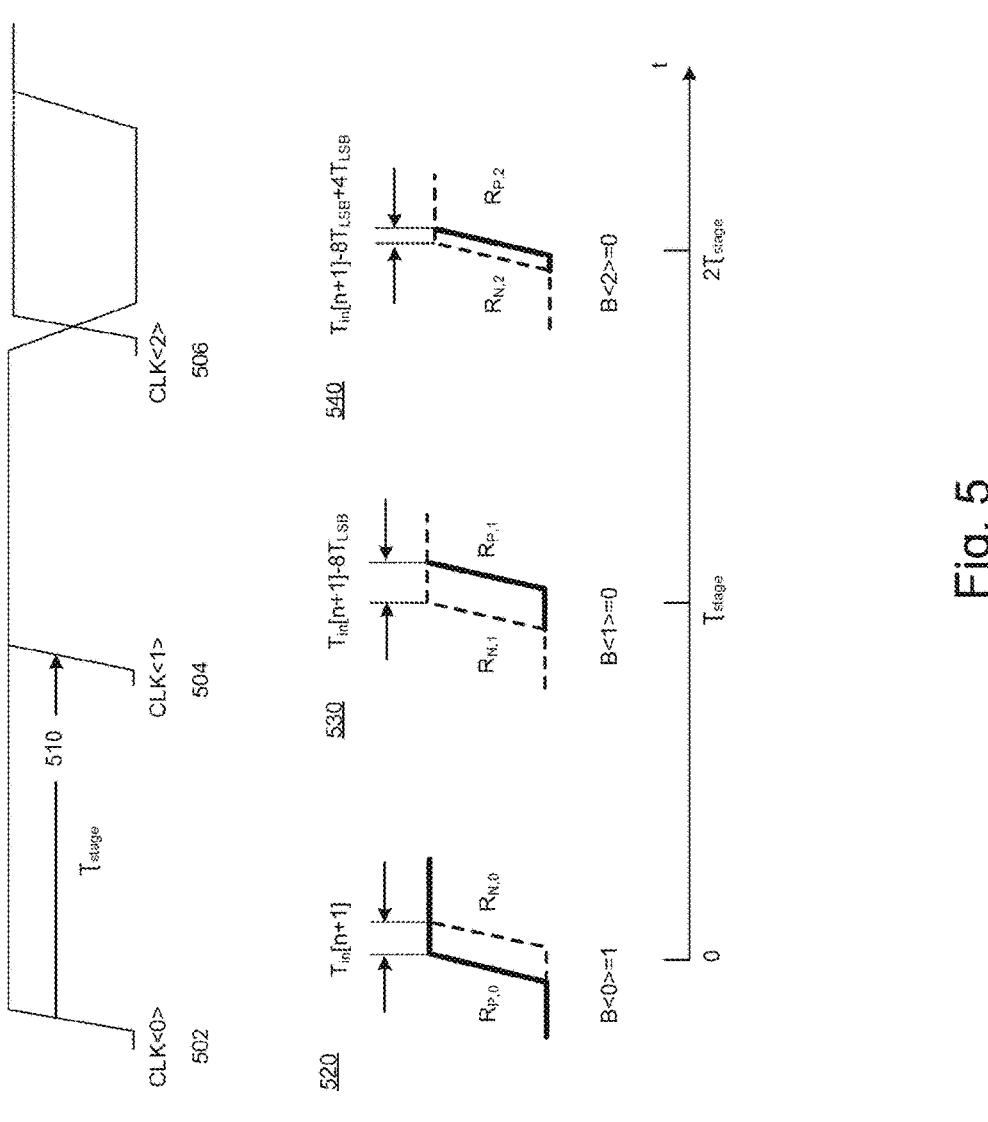
FIG. 5 depicts an example system timing performance, in accordance with present implementations.

FIG. 5 depicts an example system timing performance 500, in accordance with present implementations. As illustrated by way of example, FIG. 5 can include at least a clock pulses 502, 504 and 506, a stage period 510, a first stage waveform alignment 520, a second stage waveform alignment 530, and a third stage waveform alignment 540.

The clock pulses 502, 504 and 506 can each correspond to distinct bit positions of an input. For example, each of the clock pulses 502, 504 and 506 can respectively correspond to the zeroth, first and second bit positions corresponding to the bit output nodes 130, 132, 134. The stage delay 510 can correspond to a propagation delay corresponding to the SAR TDC stage 110. Subsequent stage delay can correspond, for example to the SAR TDC stages 112 and 114.

The first stage waveform alignment 520 can correspond to an alignment of a first input waveform and a second input waveform. The first and second input waveforms can, for example, be received at nodes 104 and 106, respectively, of the SAR TDC stage 110. The first input waveform can have a rising edge that rises earlier than a rising edge of the second input waveform. The first input waveform and the second input waveform can have a first delay offset. For example, the first delay offset can correspond to a time period corresponding to a time period of an input stage, Tin[n+1].

The second stage waveform alignment 530 can correspond to an alignment of a first delayed input waveform and a second delayed input waveform, subsequent to the first stage. The first and second delayed input waveforms can, for example, be received at input nodes, respectively, of the SAR TDC stage 112, from output nodes of the SAR TDC stage 110. The first delayed input waveform can have a rising edge that rises later than a rising edge of the second delayed input waveform, due to an adjusted of each delayed waveform. The first delayed input waveform and the second delayed input waveform can have a second delay offset. For example, the second delay offset can correspond to a time period corresponding to a time period of an input stage, Tin[n+1], minus a delay modifier corresponding to a multiple of a time period of delay of the least significant bit of the output 130. For example, the multiple can be 8.

The third stage waveform alignment 540 can correspond to an alignment of a first delayed input waveform and a second delayed input waveform, subsequent to the second stage. The first and second delayed input waveforms can, for example, be received at input nodes, respectively, of the SAR TDC stage 114, from output nodes of the SAR TDC stage 112. The first delayed input waveform can have a rising edge that rises earlier than a rising edge of the second delayed input waveform, due to an adjusted of each delayed waveform. The first delayed input waveform and the second delayed input waveform can have a third delay offset. For example, the third delay offset can correspond to a time period corresponding to a time period of an input stage, Tin[n+1], minus a first delay modifier corresponding to a first multiple of a time period of delay of the least significant bit of the output 130, plus a second delay modifier corresponding to a second multiple of a time period of delay of the least significant bit of the output 130. For example, the second multiple can be 4. Thus, the technical solution can provide a high speed alignment mechanism for an ADC based on cascading delays selectable at each SAR TDC stage of the cascade structure.

Figure 6:
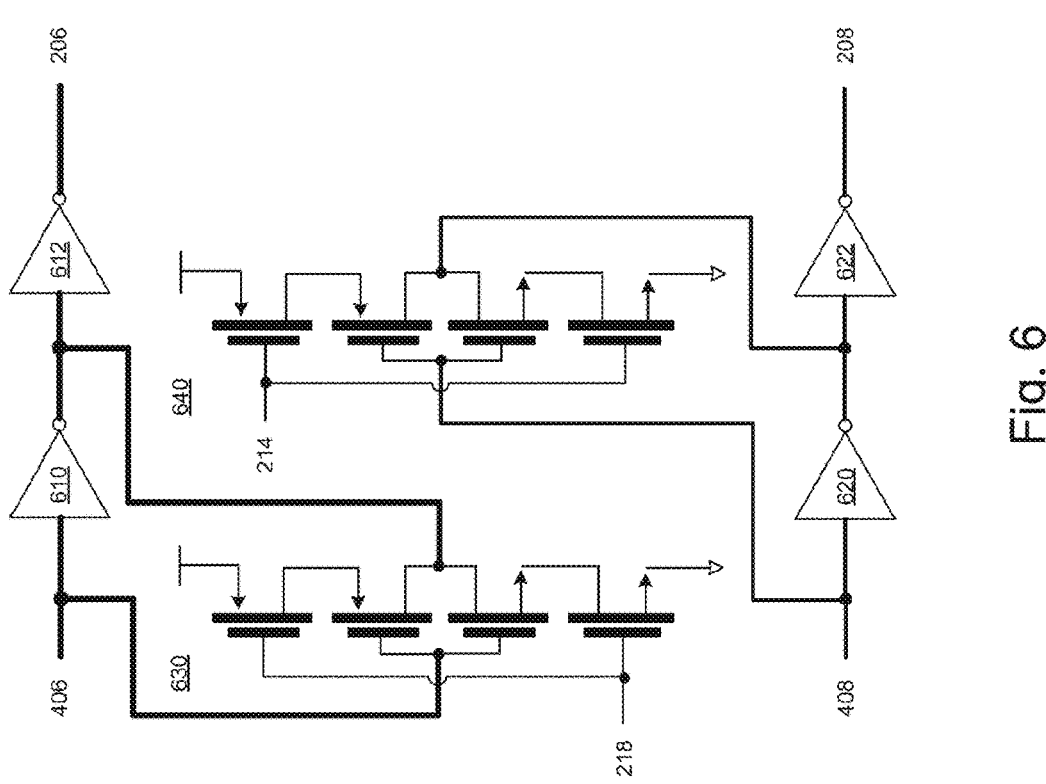
FIG. 6 depicts an example delay difference generation cell, in accordance with present implementations.

FIG. 6 depicts an example delay difference generation circuit 600, in accordance with present implementations. As illustrated by way of example, FIG. 6 can include at least a first path delay circuit 610, a first path delay circuit 612, a second path delay circuit 620, a second path delay circuit 622, a first transistor array 630, and a second transistor array 640. The first channel delay circuits 610 and 612 can be coupled in series with each other and with node 406 as input and node 206 as output. The second channel delay circuits 620 and 622 can be coupled in series with each other and with node 408 as input and node 208 as output. The first channel delay circuits 610 and 612 can include amplifiers or inverters, for example. The first transistor array 630 can include a plurality of transistors coupled in series between a supply and ground voltage by source and drain terminals, and with node 218 as input at gate terminals. The first transistor array 630 can be coupled in parallel with the first channel delay circuit 610. The second transistor array 640 can include a plurality of transistors coupled in series between a supply and ground voltage by source and drain terminals, and with node 214 as input at gate terminals. The second transistor array 640 can be coupled in parallel with the second channel delay circuit 620.

Present implementations can include a delay-tracking pipelined SAR TDC and its timing diagram for a binary SA search. The SAR TDC can include but is not limited to five 1-bit stages, with each stage using a time comparator to perform a single bit trial, and an delay difference generation cell to add or subtract a proper reference time. The operation mode of the time comparator can be controlled by CLK. When CLK is LOW, the outputs can be reset to VDD. When CLK is HIGH, the first rising edge of the two input pulses can trigger the comparator. Without pipelining, the same CLK signal can be connected to all comparators, and can remain HIGH until the input pulses completely propagate through the five conversion stages, thereby limiting the TDC throughput. Alternatively, applying conventional TDC pipelining technique can result in adding additional delay to the signal path, to match the delay of each stage with the CLK period, which inevitably degrades the signal SNR or incurs significant power/area overhead to lower the added noise. Present implementations can advantageously include a delay (t stage) between the CLK signals for the 5-stage comparators, i.e., CLK<0:4> in FIG. 2, which does not degrade the signal SNR. The CLK delay can track with the propagation delay of the 1-bit stage (including the comparator and SDT delay), such that the CLK signal can return to LOW as soon as the input pulse propagates to the next 1-bit stage and the decision result is cached, thus increasing the throughput. As a result, two input pulses can be simultaneously processed by the SAR TDC. Present implementation can thus include a delay-tracking pipelined-SAR TDC, which helps double the throughput to reach 5 GS/s.

Present implementations can include a two-step converter that can perform the first 3 MSB conversions using a Flash TDC, and can generate residue time signals (RP and RN) followed by the 5 LSB conversions via SAR TDC, as shown in FIG. 3. The Flash TDC and residue time generation help reduce the maximum delay required for SDT cells in SAR TDC, and hence enable optimization of the jitter performance of the SDT cells.

Figure 7:
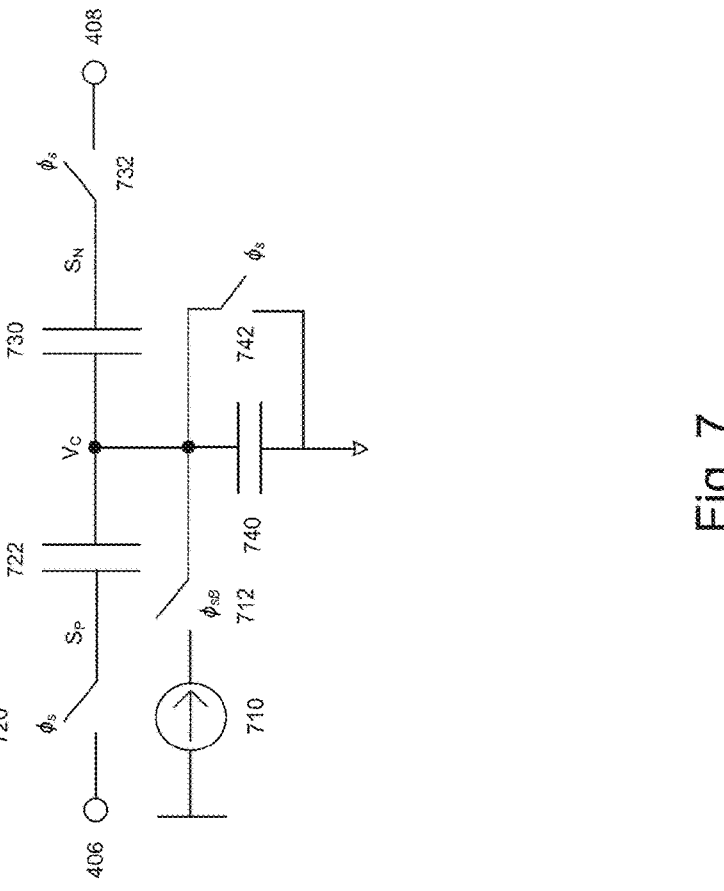
FIG. 7 depicts an example common mode ramp generation circuit, in accordance with present implementations.

FIG. 7 depicts an example ramp circuit 700, in accordance with present implementations. As illustrated by way of example, FIG. 7 can include at least a current source 710, a switch 712, a switch 720, a capacitor 722, a capacitor 730, a switch 732, a capacitor 740, and a switch 742.

Figure 8:
FIG. 8 depicts an example preprocessing circuit, in accordance with present implementations.

FIG. 8 depicts an example preprocessing circuit 800, in accordance with present implementations. As illustrated by way of example, FIG. 8 can include at least a first transformed signal input node 802, a second transformed signal input node 804, a first driver 810, a second driver 812, a first delay circuit 820, a first delay circuit 822, a first delay circuit 824, a second delay circuit 830, a second delay circuit 832, a second delay circuit 834, a first comparator 840, a second comparator 840, a first selector circuit 850, a second selector circuit 852, and a delay difference generation stage 860. The first transformed signal input node 802 and the second transformed signal input node 804 can respectively correspond to the first and second outputs of the signal transformer 420. The first driver 810 and the second driver 812 can respectively correspond to amplifier circuits.

The first delay circuits 820, 822 and 824 can respectively correspond to delay circuit having one or more of structure and operation corresponding to the delay stages 120, 122, 124 and 126. The first delay circuits 820, 822 and 824 can be coupled in series with each other and with the first driver 810 as input. The second delay circuits 830, 832 and 834 can respectively correspond to delay circuit having one or more of structure and operation corresponding to the delay stages 120, 122, 124 and 126. The second delay circuits 830, 832 and 834 can be coupled in series with each other and with the second driver 812 as input. The first comparator 840 and the second comparator 842 can have one or more of structure and operation corresponding to the comparators 210 or 300.

The first selector circuit 850 and the second selector circuit 852 can correspond to multiplexers respectively coupled with a multi-bit channel as input and a single bit channel as output. For example, the multi-bit channel can correspond to an input to each of the first delay circuits 820, 822 and 824 and an output of the first delay circuit 824. The delay difference generation stage 860 can correspond to multiplexers respectively coupled with a multi-bit channel as input and a single bit channel as output. For example, the multi-bit channel can correspond to an input to each of the second delay circuits 830, 832 and 834 and an output of the second delay circuit 834.

FIG. 8 shows an example residue time generation and the first stage Flash TDC. The input pulses from the VTC block can be first delayed by three coarse delay cells (each with a nominal delay of 16 ps). For example, present implementations are not limited to the number of delay cells as illustrated herein. Those delayed pulses can be cross-compared with the input pulses via time comparators, which can create eight quantization levels, i.e., 3-bit Flash TDC. Afterwards, the residue time can be generated by selecting the closest two rising edges between the input pulses and the coarse delayed pulses. A residue time range can be re-adjusted from [0, 16 ps] to [−8 ps, 8 ps] by an SDT cell, to properly interface with the following-stage pseudo differential SAR TDC operation.

Figure 9:
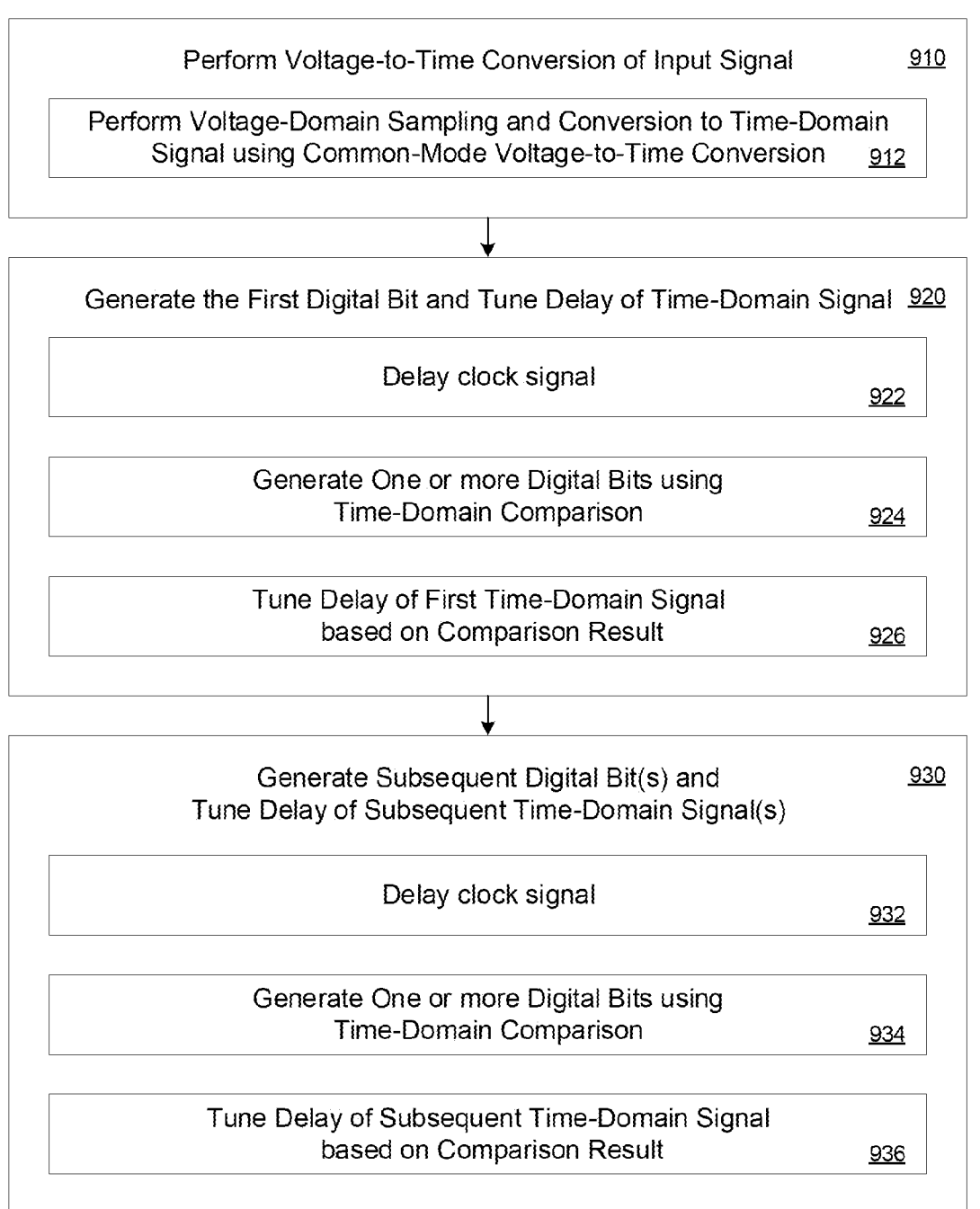
FIG. 9 depicts an example method, in accordance with present implementations.

FIG. 9 depicts an example method, in accordance with present implementations. At least the system 400 can perform method 900. At 910, the method 900 can perform a voltage-to-time conversion of an input signal. At 912, the method 900 can perform a voltage-domain sampling and a conversion to a time-domain signal using a common-mode voltage-to-time conversion. At 920, the method 900 can generate a first digital bit and tune a delay of a first time-domain signal. At 922, the method 900 can delay a clock signal. At 924, the method 900 can generate one or more digital bits using a time-domain comparison. At 926, the method 900 can tune a delay of a first time-domain signal based on a comparison result. At 930, the method 900 can generate a subsequent digital bit(s) and tune a delay of one or more subsequent time-domain signal(s). At 932, the method 900 can delay a clock signal. At 934, the method 900 can generate one or more digital bits using a time-domain comparison. At 936, the method 900 can tune a delay of a subsequent time-domain signal based on a comparison result.

Figure 10:
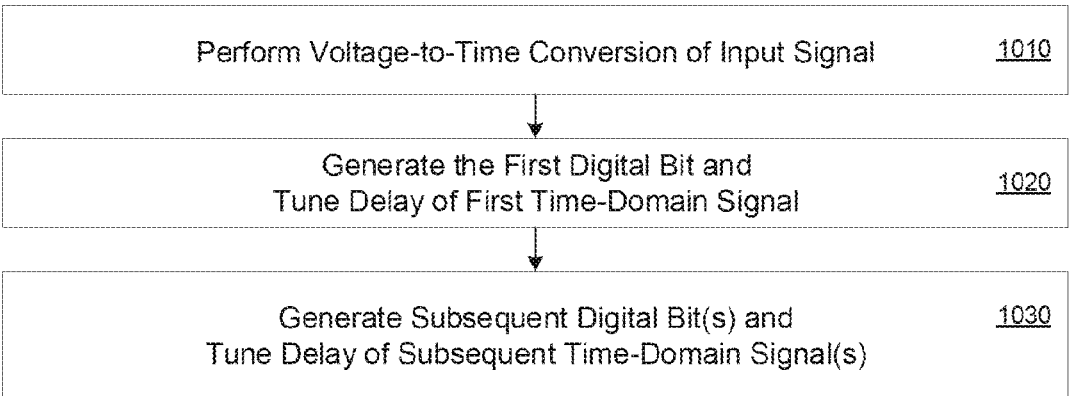
FIG. 10 depicts an example method, in accordance with present implementations.

FIG. 10 depicts an example method, in accordance with present implementations. At least the system 400 can perform method 1000. At 1010, the method 1000 can perform a voltage-to-time a conversion of an input signal. At 1020, the method 1000 can generate a first digital bit and tune a delay of a first time-domain signal. At 1030, the method 1000 can generate subsequent digital bit(s) and tune a delay of subsequent time-domain signal(s).

Figure 11:
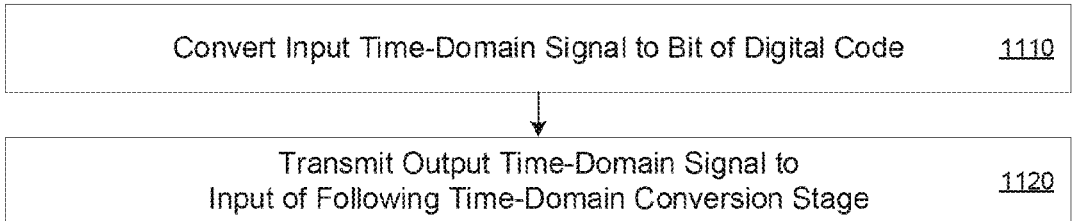
FIG. 11 depicts an example method, in accordance with present implementations.

FIG. 11 depicts an example method, in accordance with present implementations. At least one of the system 400 can perform method 1100. At 1110, the method 1100 can convert an input time-domain signal to a bit of a digital code. At 1120, the method 1100 can transmit an output time-domain signal to an input of a following time-domain conversion stage.

The method can include a first delay cell having an input coupled with a first input of the comparator, the first delay cell to generate a third delay signal based on the first analog input signal and the first select signal. The method can include the first variable output circuit to generate the first delay signal based on the third delay signal and the first analog input signal. The method can include a first variable output circuit having an input coupled with an output of the first delay cell. The method can include generating, by a second delay cell having an input coupled with a second input of the comparator, a fourth delay signal based on the second analog input signal and the second select signal. The method can include generating, by the second variable output circuit, the second delay signal based on the fourth delay signal and the second analog input signal. The method can include a second variable output circuit having an input coupled with an output of the second delay cell. The method can include receiving, by the first comparator, a clock signal. The method can include generating, by the first comparator, the first select signal and the second select signal based on the clock signal. The method can include receiving, by a third delay circuit, a second clock signal. The method can include generating the clock signal having a third time delay.

The SAR TDC stage can include a comparator to compare an input time-domain signal and generate a comparison output result. The apparatus can include a following delay difference generation cell that can tune the delay of a top delay path and a bottom delay path according to the comparison output result. The SAR TDC stage can be configured to convert the input signal into one or a plurality of digital bits. The device can include one or more of the plurality of SAR stages having a radix equal to or less than 2, the plurality of SAR stages configured to convert the input time signal to digital code successively in accordance with a cascade configuration. The SAR TDC stage can include a comparator configured to perform a time-domain signal comparison. The apparatus can include a delay cell configured to generate a delay based on a time difference between two input signal to the SAR TDC.

The device can include one or more inverters coupled with the tunable delay cell and having a tunable pull-down strength. The device can include one or more of the inverters arranged in one or more series paths each having a corresponding tunable delay. The device can include the voltage sampling capacitors and the common-mode capacitor connected to one or more of a bottom plate of the device corresponding to a ground node and the center node. The device can include a plurality of common-mode capacitors can include the common-mode capacitor, where one or more of the plurality of common-mode capacitors are connected to the center node of the voltage sampling capacitors. The device can include a plurality of current sources can include the current source, where one or more of the plurality of current sources are configured to charge the common-mode capacitor.

The method can include performing a time-domain signal comparison. The method can include generating a delay based on a time difference. The method can include converting the input time-domain signal into one or more bits of the digital code.

The herein described subject matter sometimes illustrates different components contained within, or connected with, different other components. For example, such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. An analog-to-digital converter comprising:
a pipelined successive approximation register (SAR) time-to-digital converters (TDC) device, comprising:
a plurality of SAR TDC stages configured to convert an input time signal to a digital code including a plurality of output signals each corresponding to a SAR TDC stage among the plurality of SAR TDC stages connected to an input of a following SAR TDC stage among the plurality of SAR TDC stages,
wherein the SAR stage is controlled by a clock signal based on a delayed clock signal from a previous SAR TDC stage among the plurality of SAR TDC stages; and
a delay difference generation device comprising:
a tunable delay cell having a delay based on an input digital code and modifiable in response to tuning one or more of a pull-up strength and a pull-down strength of an inverter by a switch.

2. The device of claim 1, the SAR TDC stage comprising:
a comparator to compare an input time-domain signal and generate a comparison output result; and
wherein the delay difference generation device can tune the delay of a top delay path and a bottom delay path according to the comparison output result.

3. The device of claim 1, the SAR TDC stage configured to convert the input signal into one or a plurality of digital bits.

4. The device of claim 1, wherein one or more of the plurality of SAR stages have a radix equal to or less than 2, the plurality of SAR stages configured to convert the input time signal to digital code successively in accordance with a cascade configuration.

5. The device of claim 1, the SAR TDC stage comprising:
a comparator configured to perform a time-domain signal comparison; and
a delay cell configured to generate a delay based on a time difference between two input signal to the SAR TDC.

6. The device of claim 1, further comprising:
one or more inverters coupled with the tunable delay cell and having a tunable pull-down strength.

7. The device of claim 1, one or more of the inverters arranged in one or more series paths each having a corresponding tunable delay.

8. The device of claim 1, further comprising:
a ramp circuit configured to generate a ramped signal based on an analog input signal; and
a signal transformer configured to convert the ramped signal into a time-domain pulse.

9. The device of claim 8, further comprising:
a flash time-to-digital (TDC) converter configured to generate a signal based on the time-domain pulse; and
a residue time generation circuit configured to provide the generated signal to the SAR TDC device.

10. The device of claim 1, further comprising:
a variable delay inverter configured to modify a delayed output signal of a SAR TDC stage.

11. A pipelined time-to-digital converters (TDC) method, the method comprising:
converting, by a plurality of time-domain conversion stages, an input time-domain signal to a corresponding bit of a digital code in accordance with a cascade configuration; and
transmitting, by a time-domain conversion stage among the plurality of time-domain conversion stages, an output time-domain signal of the time-domain conversion stage to an input of a following time-domain conversion stage among the plurality of time-domain conversion stages,
wherein each stage is controlled by a clock signal based on a delayed clock signal from a previous time-domain conversion stage among the plurality of time-domain conversion stages.

12. The method of claim 11, further comprising:

performing a time-domain signal comparison; and generating a delay based on a time difference.

13. The method of claim 6, further comprising:

converting the input time-domain signal into one or more bits of the digital code.

14. The method of claim 11, further comprising:

performing a voltage-to-time conversion to generate the input time-domain signal.

15. The method of claim 11, further comprising:

generating a subsequent digital bit using a time domain comparison; and tuning a subsequent time-domain signal based on the time domain comparison.

16. A voltage-to-time converter (VTC) device, the device comprising:

a common-mode capacitor coupled with a center node of one or more voltage sampling capacitors; and a current source coupled with the common-mode capacitor and configured to charge the common-mode capacitor.

17. The device of claim 16, further comprising:

the voltage sampling capacitors and the common-mode capacitor connected to one or more of a bottom plate of the device corresponding to a ground node and the center node.

18. The device of claim 12, further comprising:

a plurality of common-mode capacitors including the common-mode capacitor, wherein one or more of the plurality of common-mode capacitors are connected to the center node of the voltage sampling capacitors.

19. The device of claim 16, further comprising:

a plurality of current sources including the current source, wherein one or more of the plurality of current sources are configured to charge the common-mode capacitor.

20. The device of claim 16, wherein the common-mode capacitor is reset responsive to conversion of a voltage signal to a time-domain signal.

\* \* \* \* \*